United States Patent
Bluck et al.

(10) Patent No.: US 7,901,539 B2
(45) Date of Patent: Mar. 8, 2011

(54) APPARATUS AND METHODS FOR TRANSPORTING AND PROCESSING SUBSTRATES

(75) Inventors: Terry Bluck, Santa Clara County, CA (US); Kevin P Fairbairn, Santa Clara County, CA (US); Michael S. Barnes, Contra Costa County, CA (US); Christopher T. Lane, Santa Clara County, CA (US)

(73) Assignee: Intevac, Inc., Santa Clara, CA (US)

( * ) Notice: Subject to any disclaimer, the term of this patent is extended or adjusted under 35 U.S.C. 154(b) by 1181 days.

(21) Appl. No.: 11/523,101

(22) Filed: Sep. 19, 2006

(65) Prior Publication Data
US 2008/0066678 A1    Mar. 20, 2008

(51) Int. Cl.
*C23F 1/00* (2006.01)
*H01L 21/306* (2006.01)
*C23C 16/00* (2006.01)
*C23C 14/00* (2006.01)

(52) U.S. Cl. ............ 156/345.32; 156/345.31; 118/719; 204/298.25; 204/298.35

(58) Field of Classification Search .............. 118/719; 156/345.31, 345.32; 414/217, 935–939; 204/298.23–298.26
See application file for complete search history.

(56) References Cited

U.S. PATENT DOCUMENTS

| 4,951,601 A * | 8/1990 | Maydan et al. ............ 118/719 |
| 2004/0151562 A1 * | 8/2004 | Hofmeister et al. ......... 414/217 |
| 2006/0102078 A1 * | 5/2006 | Fairbairn et al. ............. 118/719 |

FOREIGN PATENT DOCUMENTS

JP    08119409 A  *  5/1996

* cited by examiner

*Primary Examiner* — Karla Moore
(74) *Attorney, Agent, or Firm* — Nixon Peabody LLP; Joseph Bach, Esq.

(57) ABSTRACT

There is described apparatus and methods for transporting and processing substrates including wafers as to efficiently produce at reasonable costs improved throughput as compared to systems in use today. A key element is the use of a transport chamber along the sides of processing chambers for feeding substrates into a controlled atmosphere through a load lock and then along a transport chamber as a way of reaching processing chambers and then out of the controlled atmosphere following processing in the processing chambers.

11 Claims, 8 Drawing Sheets

APPARATUS AND METHODS FOR TRANSPORTING AND PROCESSING SUBSTRATES

FIELD OF THE INVENTION

This invention has to do with novel apparatus and methods for transporting and processing substrates in general and wafers in particular.

BACKGROUND

In the manufacture of semiconductors, a common tool, referred to as a cluster tool, is one of the key units used in the manufacture of wafers. A typical commercial device has a generally circular central area with chambers attached along the circumference. The chambers extend outward around the central area. When wafers are processed they are moved first from an input output station on the circumference of the central chamber into the central chamber and then from the central chamber into an attached or circumferential chamber where processing is performed. In this tool as in substantially all manufacturing systems used today, the practice is to process wafers one at a time. A wafer may be moved into a chamber for processing and then back to the central chamber. This can be followed by a further move to another circumferential chamber and then following processing, back to the central chamber. Eventually the wafer when fully processed is moved out of the tool altogether. The movement out goes again through an input/output station or chamber which in connection with vacuum systems is generally called a load lock where the wafer moves from vacuum to atmosphere. A unit of this sort is described for example in U.S. Pat. No. 4,951,601.

Another tool indexes wafers along a central axis and feeds wafers through surrounding processing chambers. In this tool, all wafers are fed simultaneously to the next processing stop. Wafers cannot move independently although they can be processed independently. They all remain at a process station for the same amount of time but the processes at each station can be independently controlled subject of course to the maximum time permitted by the time permitted for the stop. Although the first described tool could be made to operate in this way, in fact however, it may move wafers so that they do not progress to the adjacent processing chamber in sequence and all are not required to have the same dwell time at a processing chamber.

When either of these systems is operating the central area is generally at vacuum but it may also be at some other preselected or predetermined and controlled environment. This central section for example can have present a gas that is useful to the processes being preformed in the process chambers. The chambers or compartments along the outer surface of the central zone are generally at a vacuum too but may also have a pre-selected and controlled gaseous environment. Processing is also generally performed in a vacuum by moving wafers while in vacuum from the central chamber to an attached chamber or compartment. Generally once the wafer reaches a chamber or compartment for processing, the chamber or compartment is sealed off from the central chamber. This prevents materials and/or gases used in the processing chamber or compartment from reaching the central zone preventing contamination of the atmosphere in the central zone as well as attached processing chambers and/or preventing contamination of wafers located in the central zone waiting to be processed or further processed. This also permits the processing chamber to be set at a vacuum level different than that used in the central chamber for the particular processing to be carried out in the chamber. For example, if the processing technology of a chamber requires more of a vacuum, then with a seal in place between the central zone and the chamber, the chamber itself can be further pumped down to match the process requirements for the particular processes to be performed within that chamber. Alternatively, if less of a vacuum is required, the pressure may be increased without affecting the pressure of the central chamber. After processing of the wafer is completed, the wafer is moved back to the central chamber and then out of the system. In this way the wafer may progress through this tool sequentially through the chambers and all of the available processes. Alternatively the wafer may proceed through only selected chambers and be exposed to only selected processes.

Variations on these processes are also in use in equipment offered to the field. However, they all tend to rely on a central area or zone that is integral to the various processes. Also since the predominant usage of such equipment is to make wafers, the discussion will primarily be in terms of wafers. However, it should be understood that most of the processes under discussion are also applicable to substrates in general and that the discussions should be taken to also apply to such substrates and such manufacturing equipment.

Recently there has been described a system that is distinct from these, in that it is linear in shape rather than circular and wafers move for processing from one chamber to the next chamber. Since the wafer moves in sequence from one chamber to an adjacent chamber, there is no need for the central zone as part of the equipment. In this tool a wafer enters the unit and is generally attached to a chuck that travels with the wafer as it moves through the system. In this unit, processing is performed for equal amounts of time in each chamber.

This system has a smaller footprint than is typical in this field since the footprint approximates the footprint of the processing chambers only and does not include a large central zone. This is an advantage of this type equipment. This system is described in a pending published patent application, Publication No. 2006/0102078 A1. This particular system has a uniform dwell time at each process station. This allows for some differences in processing limited of course by the length of the longest dwell period. If one requires independently controlled dwell times at the various stations, another approach may be preferred. Also this type of equipment has the disadvantage that if one station is down for repair or maintenance, then the whole system is itself unavailable for processing.

SUMMARY OF THE INVENTION

This invention is directed to a novel wafer processing unit intended to permit separately controlled dwell times at processing stations while maintaining a small footprint. It also allows ongoing operations even if one or more of the stations is down for one reason or another. In part this is in recognition that the costs of manufacturing semiconductors is extremely high and costs are increasing. The higher the costs the greater the risks in undertaking investments in this field. An objective is to define equipment that lowers costs by a reasonable percentage and provides improved systems and services in accordance with "Lean" principles of manufacture. Thus an objective is to maximize processing chambers while maintaining a small footprint. Another objective is to maximize process station utilization. Another objective is to simplify robotics and the service of this equipment. The system will also offer considerable redundancy, including up to 100% availability of the system for processing even during mainframe servicing. In such an event less chambers will be in use but all processes can continue to be available for treatment of wafers. And servicing or processing chambers will be possible from the back or front of the processing chambers. Additionally, in the preferred embodiment the processing chambers will be set up in a linear arrangement. This assures the smallest footprint for a system that permits individual programs for wafers at the various processing stations.

The processing chambers generally may have the capability of performing any of the various processes one uses in connection with processing wafers. For example in the manufacture of a wafer, the wafer would normally be carried through one or more etching steps, one or more sputtering or physical vapor deposition processes, ion implantation, chemical vapor deposition (CVD) and heating and/or cooling processes, among others. The number of processing steps to make a wafer could mean that multiple tools or tools with large subsystems would have been required if using prior art devices to perform these various processes. The instant system however, offers the further advantage that additional functional stations can be added without a significant increase in size or without the need to add new total systems.

To achieve these various objectives, transport of wafers is structured to be independent of chamber design. Thus the chambers are designed to perform as a chamber with certain processing capabilities and the transport system is structured to operate independently of chamber design and is structured to feed wafers to and from processing chambers. Transport in the disclosed preferred embodiment is dependent on a simple linkage arm based on linear and rotary motion coupled through a vacuum wall. In line with maintaining costs low, the chamber design is based on modularity. Thus in one embodiment, the system may have 3 chambers or a matching structure can be utilized and the system can have 6 chambers. Alternatively this last sentence can be repeated with 4 and 8 chambers as well as with other multiples, or modules may be matched that have a different number of processing stations.

The system is expandable and in addition it is expandable independently of technology that might be applied as future processes or applications. A linear wafer transport is used. This results in high throughput in a system of small footprint that is not over demanding of space in clean rooms. In addition different process steps can be structured into the same treatment platform.

DETAILED DESCRIPTION OF THE INVENTION

Figure 1:
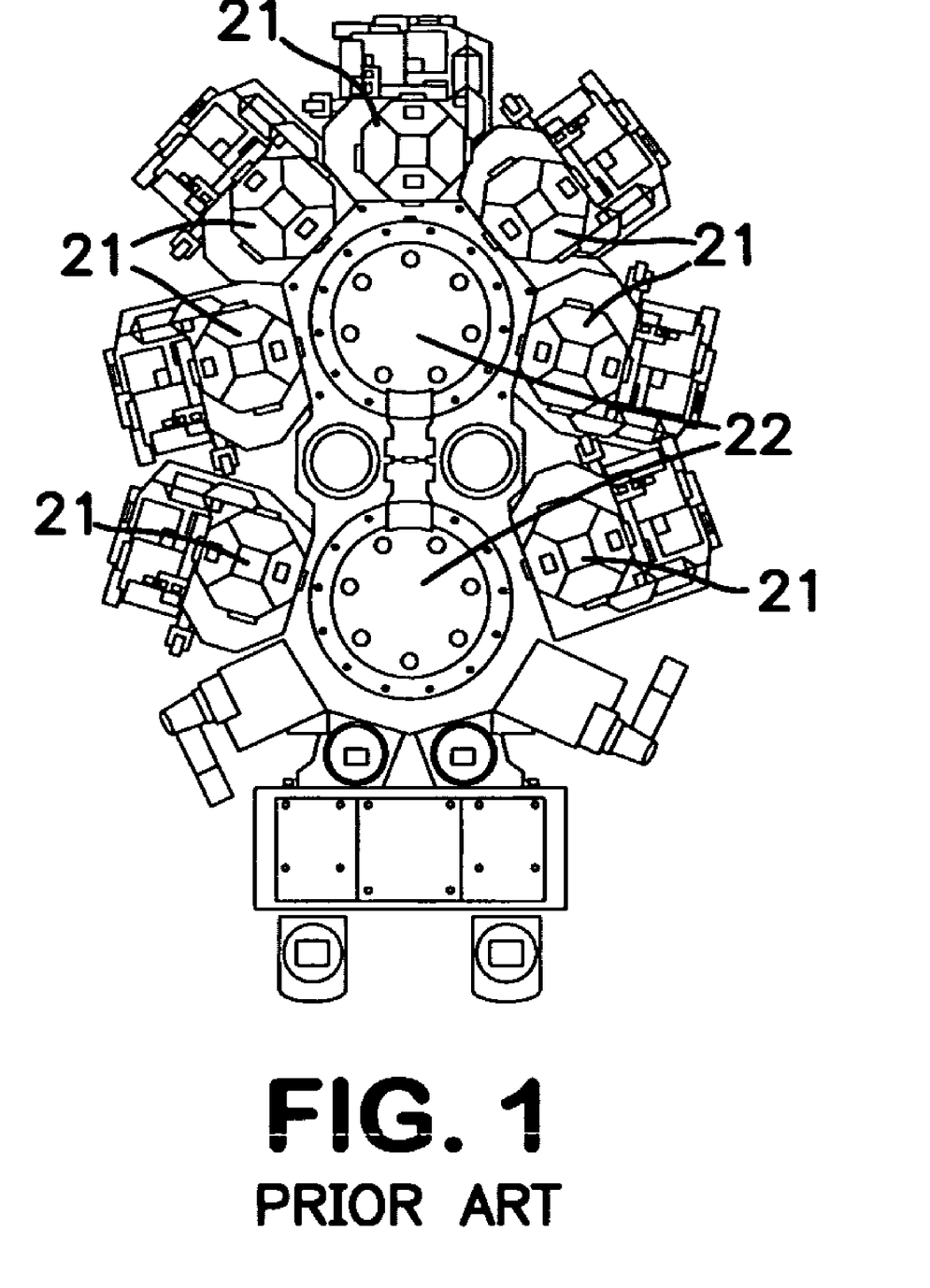
FIG. 1 is a schematic illustration of a prior art cluster tool intended for PVD applications.

Referring now to FIG. 1, there is illustrated a cluster tool of the type commonly in use today. In general this comprises processing chambers 21 radially disposed around and attached to central chambers 22. In this system, there are two central chambers. Other systems may have only a single central chamber. A system with more than two can exist except that it is cumbersome and instead users will generally acquire another system. In operation, a robot is typically located within each central chamber 22. The robot receives wafers into the system and carries wafers from the central chamber to processing chambers and after processing back to the central chamber. In some prior art systems, a central robot can access only a single wafer and single chamber at one time. Thus the robot can become engaged or busy during processing in connection while a wafer is in a single chamber. This combination of a single robot tied to a processing station during processing is a limitation on the throughput of this type of cluster tool. More modern units use robotics that are multi-armed. The processing chambers may comprise any form of processor and may comprise for example a chamber for physical vapor deposition, a chamber for chemical vapor deposition (CVD) or for etch or for other processes that may be performed on a wafer during its manufacture. This type tool permits processing for different periods of time since the transfer by the robotic arm into the chamber and its removal from the chamber when the wafer is processed is independent of other factors and is computer controlled. Obviously processing can be set for the same time and for a defined sequence.

Figure 2:
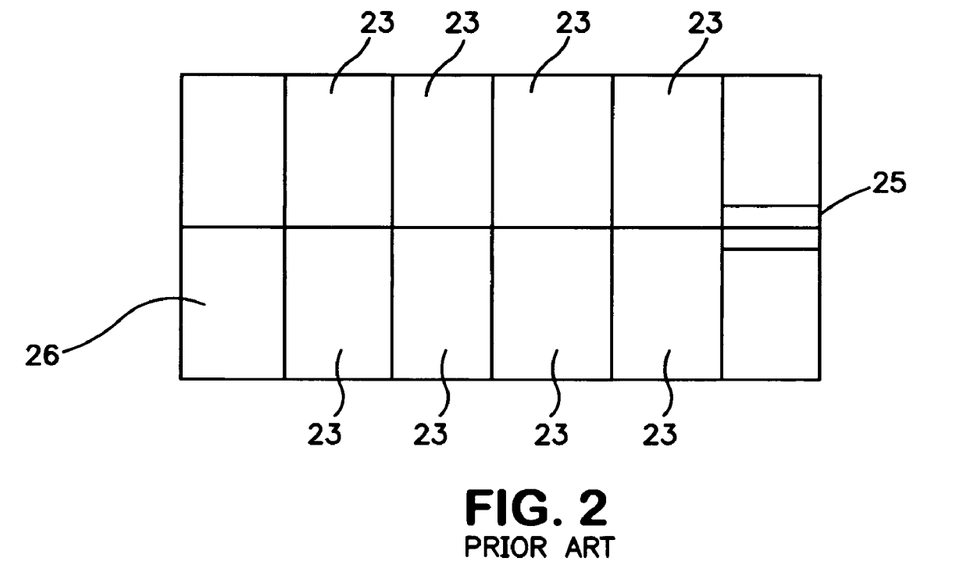
FIG. 2 is a schematic illustration of the system described in the aforementioned patent publication (2006/0102078 A1) and is in the nature of a prior art system.

Referring now to FIG. 2, there is illustrated a tool for processing wafers in which the dwell time of the wafer within a chamber is the same for each chamber. In this embodiment the processors 23 are lined up linearly and in this instance chambers are positioned adjacent to each other and also on top of one another. At the end there is an elevator 25 that moves the wafer being processed from one level to the other. At the entrance 26 a wafer enters and is positioned on a support where it remains as it moves through the system. In an embodiment of this system, the support raises the wafer to the upper level of processors and the wafer then moves in sequence one after the other through the process chambers 23 at that level. The elevator 25 changes the level of the wafer and it then moves along the other level, again from one process chamber through it and then through the next chamber and so on, and then out of the system.

Figure 3:
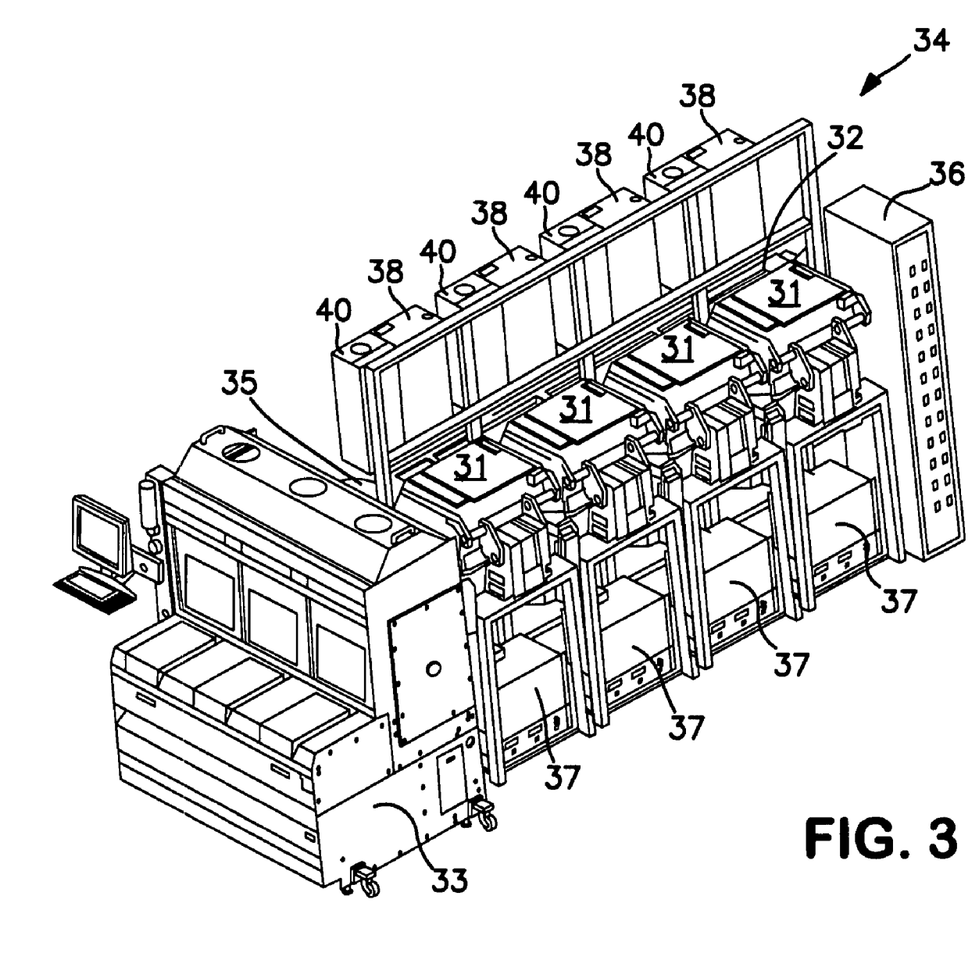
FIG. 3 is a schematic illustration of a processing system in accordance with this invention.

Referring now to FIG. 3, processing chambers 31 are located linearly along transport chamber 32. Wafers enter system 34 via front end 33 or some equivalent feeding device, front end 33 comprises a housing or enclosure where wafers are housed and kept clean while waiting to enter the processing operations. Associated with the front end may also be a feeding mechanism to place wafers into the system for processing and to remove wafers from the system to be temporarily stored after processing. A cassette of wafers is placed into the front end where wafers are then transferred one by one from the cassette by a blade that lifts the wafer from the cassette within front end 33 and carries the wafer into load lock compartment 35 thus entering the system. From load lock compartment 35 wafers travel along transport chamber 32 from which they transfer into processing chambers 31. After a substrate enters a processing chamber, the substrate leaves the support arm and rests instead on a substrate support within the chamber. At this point a valve is closed to separate the atmosphere of the processing chamber from the atmosphere of the transport chamber. This permits changes to be made within the processing chamber without contaminating the transport chamber or other processing chambers. After processing the valve separating the processing chamber from the transport chamber opens and the wafer is removed from the processing chamber and transferred along transport chamber 32 to another processing chamber for additional processing or to the load lock from which the wafer is returned to front end 33. In this Figure there are shown 4 processing chambers 31. There is also shown 4 process power supplies 37 and a power distribution unit 36. These in combination provide the electronics for the system and the power to each individual process chamber. Above the process chambers 31 are process gas cabinets 38 and information processing cabinets 40. It is through these units that information keyed into the system control movements of the substrates along transport chamber 32 and whether or not the substrate is transferred into a processing chamber for further processing. These units also provide records of what has occurred within the processing chambers. Gases are provided for use within the chambers during processing. Although the robotic handling mechanism to feed wafers into the system and through the processing stations in the system is described as a two arm system, in fact more than two arms may be present and each can be set to move independently or together within the transport travel chamber.

The processing chambers in a system may perform different processes as desired in the manufacture of wafers. Many manufacturers today buy dedicated systems in which the entire system is given over to sputter or etch processes. In essence there are sufficient sputter steps or etch steps in the manufacture of a wafer that a four or more stage system can be entirely devoted to sputtering operations. Alternatively, a wafer can be carried through a series of operations, each different yet each required in leading to a final process. For example, in a five process station, one could reasonably expect the following sequence in use. At the first process station the wafer will be subjected to a degas operation; the second station could be a precleaning station; the third a sputtering station to deposit titanium for example; the fourth a sputter station to deposit nickel vanadium for example; and, at the fifth station the sputter deposition of gold could occur.

Figure 4:
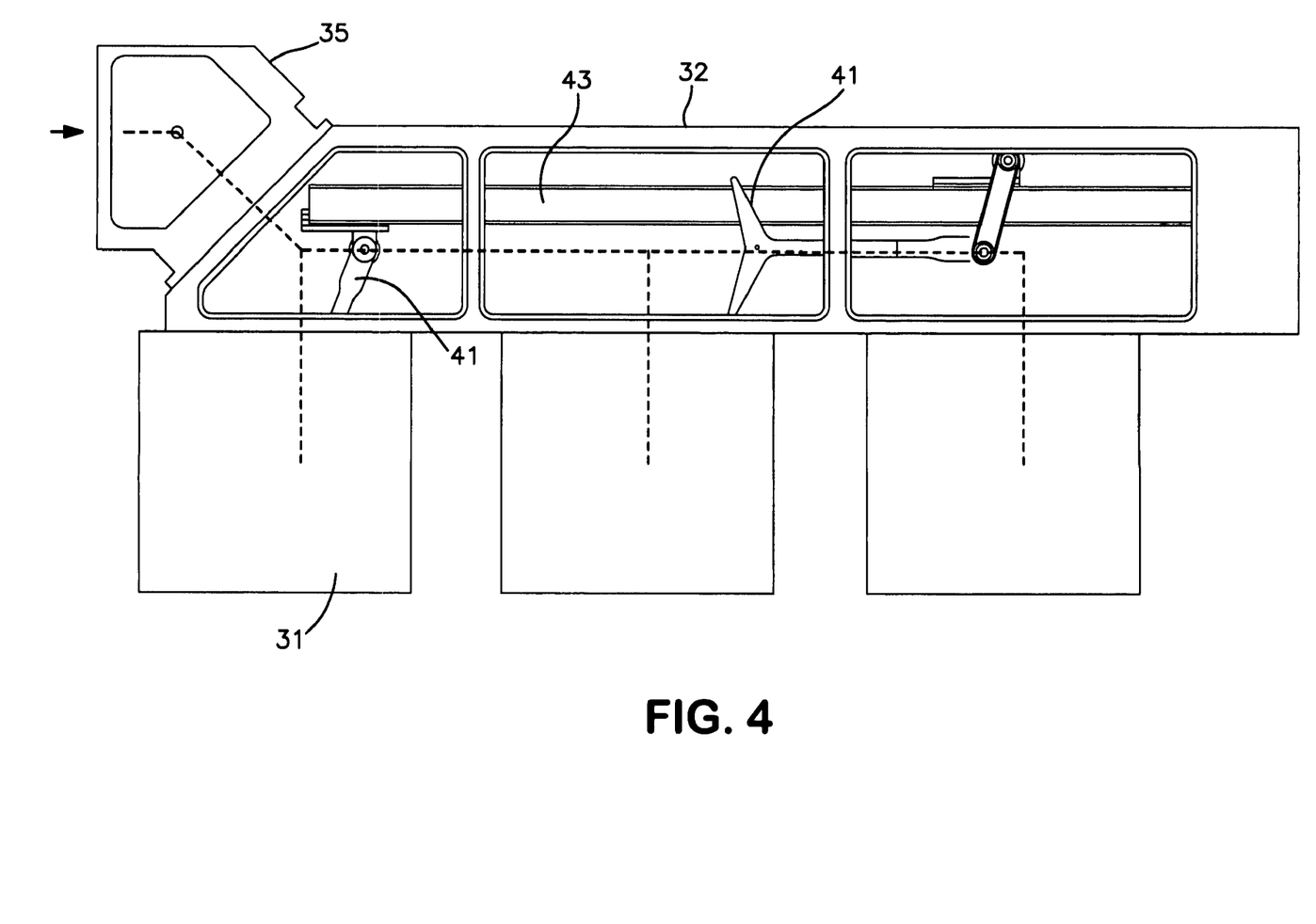
FIG. 4 is a top schematic view for purposes of more clearly illustrating the transfer chamber. In this Figure this has been done in a three process station structure but this number of stations has been used only for illustrative purposes.

Referring now FIG. 4 there is illustrated a three station system with top covers removed. An objective in connection with this Figure is to provide more of an understanding of the transport chamber 32. A wafer to be processed enters this system at load lock 35. Load lock 35 is a dual level load lock and can hold and process two wafers simultaneously. One is on a lower lever and the other on an upper level. At the load lock wafers entering the system enter into the vacuum or controlled environment. Also wafers that have been processed pass through load lock 35 during their travels leaving this system and the vacuum or other controlled conditions within the system and return into the front end (not shown in this Figure). Once a wafer completes its transition from non-vacuum conditions to vacuum conditions, the wafer is lifted by an arm 41 which moves into transport chamber 32. One such arm is visible while the other is partially covered by elements in the first processing chamber at the left. The visible arm is shown delivering a wafer into this processing chamber 31 (or alternatively removing a wafer that has been processed from this chamber). Arms 41 move along within the transport chamber on a linear rail 43. In this embodiment the rails within the transport chamber 32 hold the support arms 41 above the floor of chamber 32. Also, the driving mechanism, which is not seen in this Figure, acts from outside the vacuum through the walls of the enclosure of chamber 32. It provides a generally linear movement to arms 41 as well as a rotary movement when it is desired to extend an arm into a chamber or into load lock 35. Thus the arms are used to move a wafer into or out of the transport chamber 32, into or out of a processing chamber 31 or into and out of load lock chamber 35. By avoiding contact with the base of this chamber less particles are produced as to maintain the environment in a purer or particle free condition. Additional details of this transport system will be shown and discussed in connection with figures that follow. Also although two arms are illustrated in this figure, it should be readily apparent that a system can have more or less than two arms on a rail and can handle more than two wafer transport devices at any one time.

Figure 5:
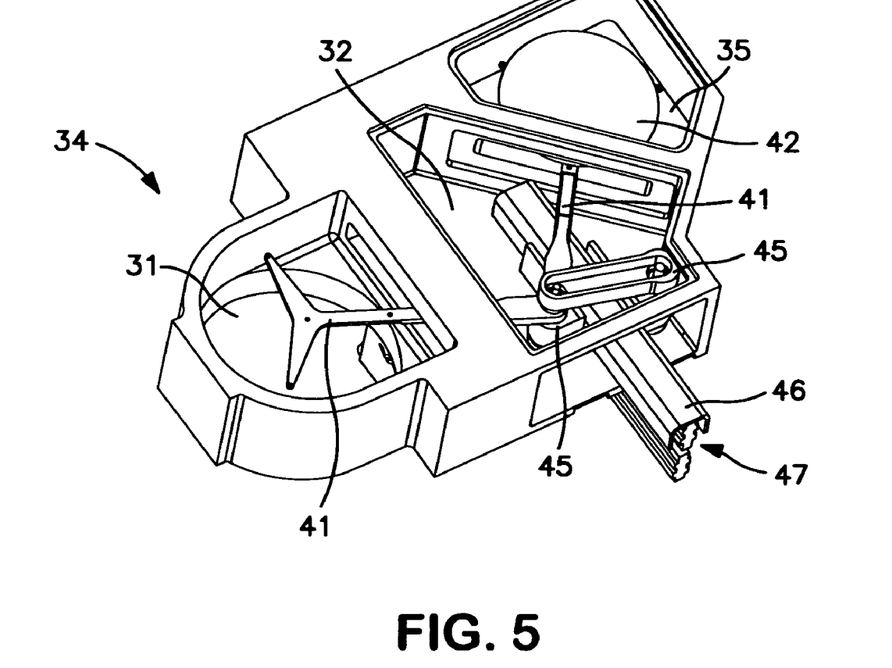
FIG. 5 is a schematic view of a segment of the system from the load lock and into the transport or transfer chamber.

Referring now to FIG. 5, this figure shows portions of system 34, without covers closing off the internal elements, starting at load lock 35, continuing into the beginning of transport chamber 32 and including a first processing chamber 31. Illustrated in this figure a wafer 42 in load lock 35 rests on arm 41. Another arm 41 is shown extended into process chamber 31. As shown the arms, which act independently and may be at different levels, can be extended into different areas at the same time. The arms move wafers along transport chamber 32 into the system from the load lock and then about the system from processing chamber to processing chamber. Eventually the arms move the wafers after processing along the transport chamber and into load lock 35 and then out of system 34. When processing is completed, the wafer may then pass back into the front end from the load lock where processed wafers are collected. A wafer in the load lock or in process chambers is transferred by being lifted on a support surface associated with arm 41. Lift pins at the support surface raise the wafer to allow the arm access below the wafer permitting the arm to lift the wafer and move the wafer for next steps in the system. Alternatively, a structure in the nature of a shelf to slide under the wafer and support the wafer during transport may be employed to support and hold the wafer and to accept and release wafers from arms 41 when brought or taken from a chamber or compartment. The arms are positioned to pass above and below each other without contact and can pass by each other. They are connected to an internal drive and support mechanism 45. Drive and support mechanism 45 is provided with a linear drive track along which drive and support mechanism travels within transport chamber 32. Movement of drive and support mechanism 45 is brought about by an external driver such as a motor. One form of drive causes drive and support mechanism 45 to move linearly along drive track 46. Another causes rotation of arms 41 to extend them from the transport chamber 32 into load lock 35 or process chambers 31 in the course of moving a wafer 42 into and through the system. Within drive track 46 are individual rails 47 (rails 47 are more clearly shown in FIG. 6) on which each drive and support mechanism independently rides enabling positioning so that each arm 41 moves and acts independently of the other. Movement of the wafer into a process chamber is in the nature of translating from its linear drive path into the chamber. This occurs because the wafer is undergoing two forms of motion simultaneously in the preferred embodiment. It is being moved linearly and rotated at the same time. The use of external motors or other forms of drive mechanism to drive this mechanism within the vacuum of transport chamber 32 reduces unwanted particles within the enclosed vacuum area.

Figure 6:
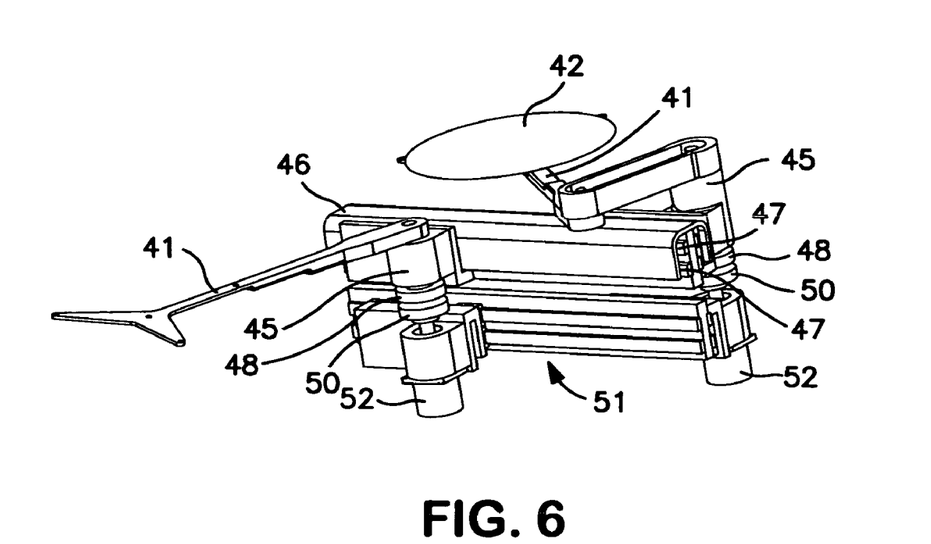
FIG. 6 is a schematic illustration of the wafer moving mechanism shown outside the encasement for the system.

Referring now to FIG. 6, there is illustrated the driving system employed in the preferred embodiment of this invention. In this figure, rails 47 of drive track 46 are each independently viewable. There is also shown a wafer 42 on one of the support arms 41. The other support arm is simply shown extended in this figure. Drive and support mechanism 45, each ride on one of rails 47. This facilitates the positioning of the arms 41 at different levels. Positioned at the base of each of the drive and support mechanism 45 is a magnetic head 48. Positioned spaced from magnetic head 48 is a driver 50. Magnetic heads 48 are positioned within the vacuum of the transport chamber and a wall of the vacuum chamber (shown as 53 in FIG. 7) passes beneath each of the magnetic heads 48 and between the magnetic heads 48 and drivers 50. Thus drivers 50 are outside the vacuum wall of transport chamber 32. As has been discussed, arms 41 move wafers 42 into and through the processing system and arms 41 move independently of one another. These arms 41 are driven by a magnetic coupler arrangement comprising driver 50 and magnetic head 48. The coupler imparts both linear and rotary motion to arms 41. Driver 50 rides on outer rails 51 which are located outside the vacuum and appear on both sides of the rail system. One set is seen in a facing relationship while another exact rail appears on the opposite side. Rotation of the arm is transferred through the magnetic couplers and is driven by rotary motors 52. Although magnetic coupling is illustrated as used for linear movement and for rotation in this figure, it should be readily apparent that separate magnetic couplers and drivers may be used. Thus, although it is preferred to transfer linear and rotational movement through the same couplers, it is also possible to use separate couplers for linear movement and another set for rotational motion.

One type of arm that may be used to move and manipulate the wafers through transport chamber 32 including stops at the process stations 31 is described as a selective compliant articulated assembly robotic arm, referred to in a shorthand way as a SCARA robot. A SCARA system tends to be faster and cleaner than the Cartesian system it would likely replace.

Also in order to reduce and/or eliminate load factors in connection with the magnetic drive system, one can include repulsing magnets that will reduce the attractive forces created by the motion coupling magnets. The magnets that couple the rotary and linear motion into the vacuum have a significant amount of attractive force. This loads the mechanical mechanism that supports the parts. High loads mean lower bearing life and more particle generation. By using magnets located in the magnetic couplers or in a separate arrangement that repulse each other the attractive force can be reduced. In fact, inside the magnetic coupler the inner most magnets are not significant in achieving coupling stiffness. These inner magnets can however, be used to create a repulsive force with the coupling magnets used in attraction disposed in alternating N-S positions around the diameter of the coupler.

It should be understood of course that if one is not concerned about particle dust within the enclosed chambers, then drive mechanism may be included within the enclosed chambers.

Figure 7:
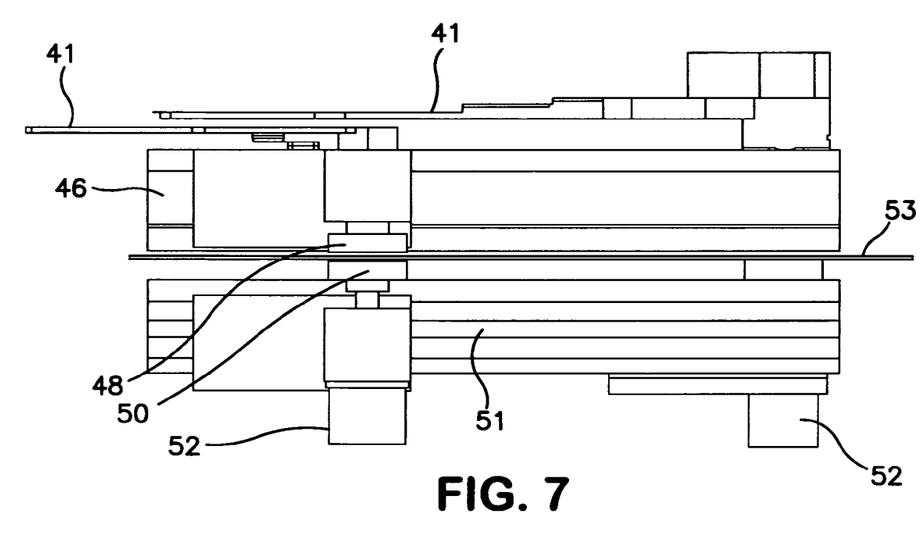
FIG. 7 is a schematic illustration of the track and drive system employed in the preferred embodiment.

Referring now to FIG. 7, there is shown a side view, without cover, of the track and drive system. In this figure, the vacuum wall 53 is illustrated in its position between magnetic couplers 48 and 50 that drive and control the position of arms 41. Drive track 46 encloses rails 47 which provide linear motion imparted by outer rails 51 to drive and support mechanism 45 and thus to arms 41. Rotational motion is imparted by rotary motors 52.

Figure 8:
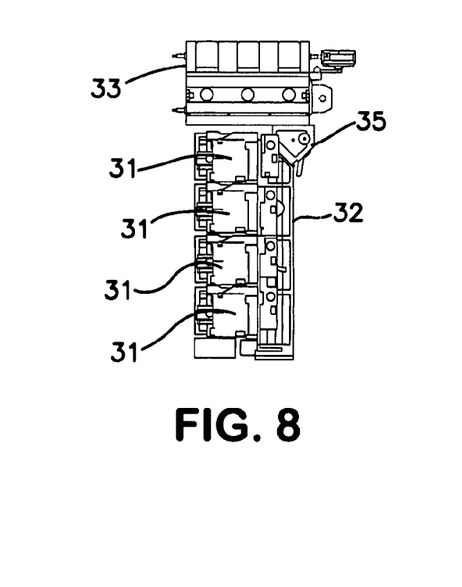
FIG. 8 is a schematic illustration of a 4-station physical vapor deposition (PVD) or sputtering system in accordance with this invention.

Referring now to FIG. 8 there is illustrated a processing system in accordance with this invention. As in the case of FIG. 3, front end 33 receives and stores wafers for presentation to system 34 including process chambers 31, which in this embodiment are intended to illustrate chambers in which sputter deposition occurs, by transferring the wafers first to load lock 35 and then along transport or transfer chamber 32. Processed wafers are then fed back along transfer chamber 32 to load lock 35 and then out of the system to front end 33.

Figure 9:
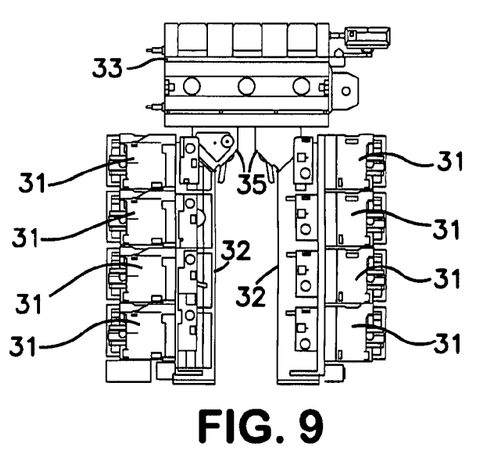
FIG. 9 is a schematic illustration of an 8-station system in accordance with this invention.
Figure 10:
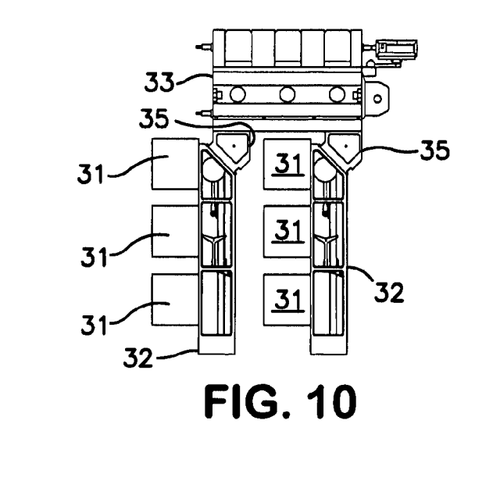
FIG. 10 is a schematic illustration of a 6-chamber system in accordance with this invention.

Referring now to FIG. 9 there is illustrated an eight station processing system in accordance with this invention, front end 33 feeds wafers to load locks 35. Wafers are then moved along transport chambers 32 and from transport chambers 32 into processing chambers 31. In this figure both sets of transport chambers are positioned in the central area and the process chambers 31 are on the outer sides. In FIG. 10 the processing sections are all lined up so that one set of processing chambers is a duplicate of the next set. Thus the processing chambers of the system appear lined up in parallel.

Figure 11A:
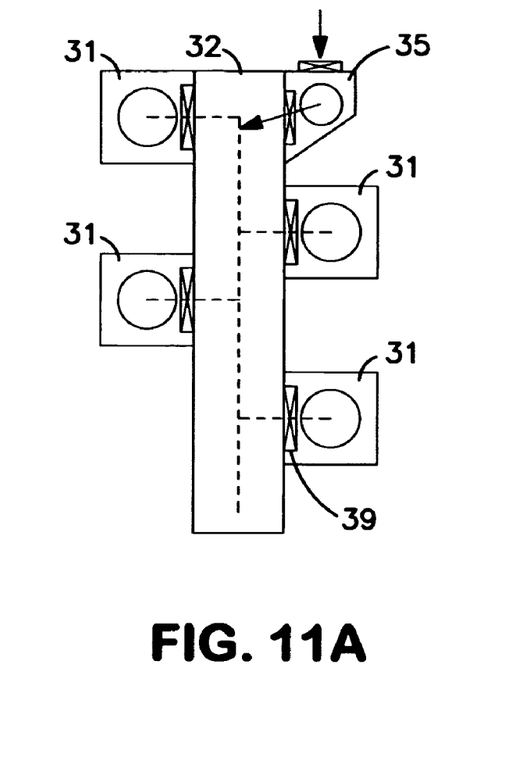
FIGS. 11A and 11B are schematic illustrations of two different embodiments of this invention.
Figure 11B:
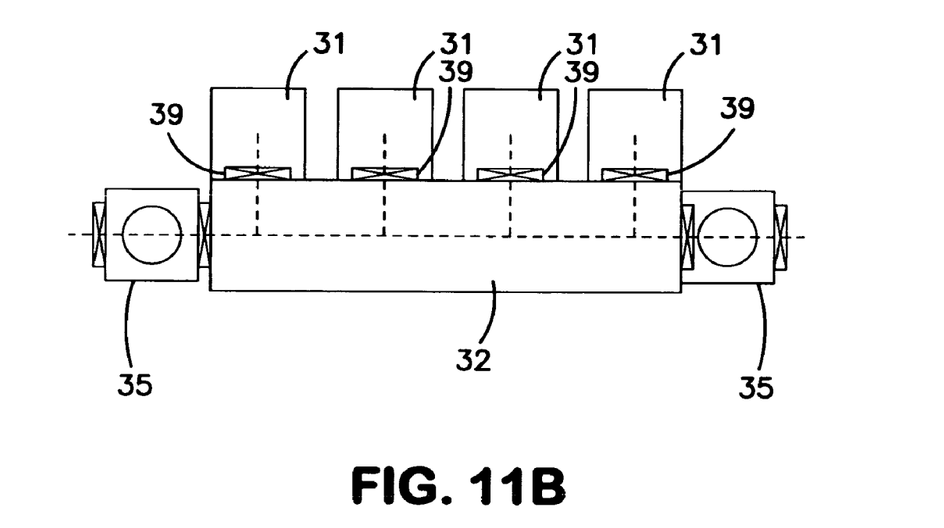

Other variations are readily possible and easily conceived. For example, instead of lining up the processing chambers as shown in FIGS. 9 and 10, processing chambers could be positioned one set above another or one set following another. If aligned with one set following another, the sets can be lined up so that the second set continues in line following the first set or alternatively the second set can be set at some form of angle to the first set. Since a transport chamber can feed wafers to each side of the chamber, two sets of processors can be set around a single transport chamber and fed by the same transport chamber (see FIG. 11A where numbers designate the same items as were discussed in connection with earlier figures. It is noted that added to FIGS. 11A and 11B is a showing of the valve 39 that separates the processing chambers 31 from the transport chambers 32 as has been discussed above.) If the second set of processors is a continuation of the first set there can sometimes be benefits to positioning additional load locks along the system. It is of course possible to add a front end at the far end and position a load lock before the front end so that the wafer can travel in a straight line entering at one end and leaving at the other (see FIG. 11B, where again numbers designate the same item as in earlier figures). In this latter case, the wafer can be programmed to enter or leave at either or both end(s). It is also possible to position processing chambers along the transfer chamber at irregular intervals or with spacing between the processing chambers. In this arrangement the key feature will be the positioning of the transfer chamber so that it can feed wafers to the individual processing chambers as desired and as directed by the computer controls for the system.

Although the chambers have been described as under vacuum conditions, in fact in some instances there can be benefits to including certain gases or other fluids in the contained areas. Accordingly the term vacuum as used herein should also be interpreted as a self contained environment as to encompass special gases for example that may be employed in the total system.

In FIG. 1, the cluster tool includes 7 processing chambers. In FIG. 9 the disclosed system includes 8 processing chambers. The total footprint of the tool in FIG. 1 with peripherals is approximately 38 $m^2$. The total footprint of the tool in FIG. 9 (with an additional processing chamber and peripherals) is 23 $m^2$. Thus the footprint for a system with more chambers is considerably less if a linear arrangement in accordance with this invention is employed. In large measure this improvement is achieved through the use of an improved feed system illustrated as transport chamber 32 in FIG. 9 as compared to the use of central sections as is done with the system of the type shown in FIG. 1.

The linear architecture of the present invention is extremely flexible and lends itself to multiple substrate sizes and shapes. Wafers used into the fabrication of semiconductors are typically round and about 200 or 300 mm in diameter. The semiconductor industry is always trying to get more devices per wafer and has steadily moved to larger and larger wafer sizes from 75 mm, 100 mm, 200 mm to 300 mm and there is an on going effort to look at moving to 450 mm diameter wafers. Due to the unique architecture the floor space required in the clean room wafer fab would not grow as large as it would with a typical cluster tool with the processes located on the circumference.

Further if it is desired to increase the size of the cluster tool type (FIG. 1) to increase output, the add on to the total measurements is to a raised power; whereas, an increase in size of the system described in this application is in a single direction, i.e., length, with the width of the system staying the same. In similar processes, such as an aluminum process, throughput for the same period of time using the system of the type illustrated in FIG. 9, which occupies less space than the equipment shown in FIG. 1, the equipment of FIG. 9 produces almost twice as many wafers (in quick calculations about 170%) as does a system like that of FIG. 1. Thus there is a considerable improvement in wafer output per a measured clean room area using the system disclosed as compared to prior art units. Obviously this achieves an objective of reducing costs in the manufacture of wafers.

The design of this equipment is not limited to circular substrates. A cluster tool that moves wafers in paths described by arcs is particularly disadvantaged if the substrates are rectangular as the tool would need to be sized to handle a circular substrate that inscribes the rectangular shape of the actual substrate; whereas, the linear tool need be no larger in any direction than what is required to pass the actual shape. For example, working with a 300 mm square substrate, a cluster tool would need to be sized to handle a 424 mm circular substrate while the linear tool need be no larger than that required for a 300 mm circular substrate.

Also the size of the transport chamber 32 need provide only that room required to move the substrate whether a wafer of some other member, along from the entrance chamber through and into processing chambers and from processing chambers out of the system. Thus the width of this chamber should be slightly larger than the size of the substrate to be processed. However, smaller members may be processed in the system, and may be processed together as a plurality in a substrate holder.

While this invention has been discussed in terms of exemplary embodiments of specific materials, and specific steps, it should be understood by those skilled in the art that variations of these specific examples may be made and/or used and that such structures and methods will follow from the understanding imparted by the practices described and illustrated as well as the discussions of operations as to facilitate modifications that may be made without departing from the scope of the invention defined by the appended claims.

The invention claimed is:

1. A substrate processing system, comprising:
    a substrate transfer chamber supporting vacuum condition;
    a linear drive track inside the substrate transfer chamber within the vacuum condition;
    a support mechanism riding on the linear drive track;
    a magnetic head attached to the support mechanism within the vacuum condition;
    a support arm connected to the support mechanism and coupled to the magnetic head;
    a driving mechanism comprising a driver positioned outside the vacuum and acting on the magnetic head from outside the vacuum through wall of the chamber to provide the support arm both linear and rotary movements through the magnetic head; and wherein the driving mechanism further comprises outer rails located outside the vacuum and wherein the driver rides on the outer rails.

2. The substrate processing system of claim 1, further comprising:
    a second support mechanism riding on the linear drive track;
    a second support arm connected to the second support mechanism; and,
    a second driving mechanism acting from outside the vacuum through wall of the chamber to provide the second support arm linear and rotary movements.

3. The substrate processing system of claim 2, wherein the support arms are positioned to pass above and below each other and without contact.

4. The substrate processing system of claim 2, wherein the support arms can pass by each other.

5. The substrate processing system of claim 2, wherein the support mechanisms independently ride on the linear drive track, whereby each arm moves and acts independently of the other.

6. A substrate processing system, comprising:
    a loadlock;
    a substrate transfer chamber connected to the loadlock and supporting vacuum condition;
    a linear drive track inside the substrate transfer chamber within the vacuum condition;
    a first and second support mechanisms riding on the linear drive track;
    a first and second support arms connected respectively to the first and second support mechanisms; and,
    a magnetic coupler arrangement acting from outside the vacuum through vacuum wall of the chamber to provide each of the support arms both linear and rotary movements;
    wherein the first support arm is a straight arm while the second support arm is a selective compliant articulated assembly robotic arm (SCARA), and wherein the SCARA is positioned to pass above the straight arm;
    wherein the magnetic coupler arrangement comprises magnetic heads positioned on the support mechanisms and drivers positioned outside the vacuum wall; and,
    outer rails located outside the vacuum and wherein the drivers ride on the outer rails.

7. The substrate processing system of claim 6, further comprising rotary motors and wherein the rotary movement is driven by the rotary motors.

8. The substrate processing system of claim 7, wherein the support arms are positioned to pass above and below each other and without contact.

9. The substrate processing system of claim 6, wherein the support arms can pass by each other.

10. The substrate processing system of claim 6, wherein the support mechanisms independently ride on the linear drive track, whereby each arm moves and acts independently of the other.

11. The substrate processing system of claim 6, wherein the linear drive track comprises linear rails and the support arms move along the linear rails.

* * * * *